United States Patent
Hung et al.

(10) Patent No.: US 8,164,939 B2
(45) Date of Patent: Apr. 24, 2012

(54) MAGNETIC SHIFT REGISTER MEMORY

(75) Inventors: Chien-Chung Hung, Hsinchu County (TW); Kuei-Hung Shen, Hsinchu (TW); Ching-Hsiang Tsai, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 207 days.

(21) Appl. No.: 12/710,373

(22) Filed: Feb. 23, 2010

(65) Prior Publication Data

US 2011/0157955 A1 Jun. 30, 2011

(30) Foreign Application Priority Data

Dec. 29, 2009 (TW) .............................. 98145664 A

(51) Int. Cl.
*G11C 19/00* (2006.01)
(52) U.S. Cl. ........................................... 365/80; 365/63
(58) Field of Classification Search ............. 365/80, 365/63

See application file for complete search history.

(56) References Cited

U.S. PATENT DOCUMENTS

| | | | |
|---|---|---|---|
| 6,834,005 B1 | 12/2004 | Parkin | |
| 7,710,770 B2 * | 5/2010 | Cowburn et al. | 365/81 |
| 2008/0278998 A1 * | 11/2008 | Cowburn et al. | 365/171 |
| 2009/0316462 A1 | 12/2009 | Xi et al. | |
| 2010/0208504 A1 * | 8/2010 | Kim et al. | 365/80 |

OTHER PUBLICATIONS

Authored by D. Ravclosona, et al., article titled "Domain Wall Creation in Nanostructures Driven by a Spin-Polarized Current," adopted from Physical Review Letters, May 12, 2006, pp. 186604-1-186604-4.

Authored by K. Miura, et al., article titled "A Novel SPRAM(SPin-transfer torque RAM) with a synthetic ferrimagnetic free layer for higher immunity to read disturbance and reducing write-current dispersion," adopted from 2007 Symposium on VLSI Technology Digest of Technical Pappers, pp. 234-235.

Authored by L. Thomas, et al., "Oscillatory dependence of current-driven magnetic domain wall motion on current pulse length," adopted from Nature, vol. 443/14, Sep. 2006, pp. 197-200.

"Office Action of Taiwan Counterpart Application", issued on Feb. 22, 2012, pp. 1-5, in which the listed reference was cited.

* cited by examiner

*Primary Examiner* — Tuan T. Nguyen
(74) *Attorney, Agent, or Firm* — Jianq Chyun IP Office

(57) ABSTRACT

A magnetic shift register memory includes a magnetic track and a reference magnetic region. The magnetic track has multiple magnetic domains. Each of the magnetic domains stores one bit data. One end of the magnetic domains is set with a first data injection domain for storing a first data, and a second data injection domain is located adjacent to the first data injection domain. The reference magnetic region corresponding to the second data injection region is implemented at a side of the magnetic track for storing a second data.

21 Claims, 8 Drawing Sheets

MAGNETIC SHIFT REGISTER MEMORY

CROSS-REFERENCE TO RELATED APPLICATION

This application claims the priority benefit of Taiwan application serial no. 98145664, filed on Dec. 29, 2009. The entirety of the above-mentioned patent application is hereby incorporated by reference herein and made a part of specification.

TECHNICAL FIELD

The disclosure relates to a magnetic shift register memory. More particularly, relates to a magnetic shift register memory with a stack-type data injection domain.

BACKGROUND

The conventional magnetic memory has been developed for many years, and in recent years, a theory and experiment of current-driven domain wall motion is provided and well developed. The document of U.S. Pat. No. 6,834,005 discloses a device structure capable of greatly increasing an information storage capacity of a chip or a hard disk, and such device structure is also referred to as a magnetic shift register memory. Such memory has a chance to substitute a current dynamic random access memory (DRAM), a static random access memory (SRAM) and a flash chip, and can even implement a technique of "disk drive on a chip". Such memory mainly applies a magnetic record disk similar to a hard disk, which is folded in a three-dimensional stack for storing data, in which the current drives a domain wall motion to record information therein. The stacking effect can greatly reduce an equivalent bit size thereof, and an operation speed thereof exceeds that of a conventional flash memory chip and a hard disk.

FIG. 1 is a schematic diagram illustrating a conventional magnetic shift register memory designed according to the current-driven domain wall motion mechanism. Referring to FIG. 1, a magnetic track 100 has a plurality of magnetic domains 102. A magnetizing direction of each magnetic domain 102 can store one bit data of "0" or "1". When the bit data of two adjacent magnetic domains are different, it represents that the magnetizing directions of the two magnetic domains are reversed, and a domain wall 104 is generated between the two magnetic domains. The domain wall 104 is shifted according to a flowing direction of an electronic current I, i.e. the magnetic domains 102 on the magnetic track 100 are shifted. When the magnetic domain 102 is shifted to pass a reading device 106 or a writing device 108, the reading device 106 and the writing device 108 can read data on the magnetic domain 102, or write data onto the magnetic domain 102.

Magnetic materials of the magnetic memory cell are classified into in-plan magnetic anisotropy (IMA) materials and perpendicular magnetic anisotropy (PMA) materials. FIG. 2 is a schematic diagram illustrating a storage mechanism of a conventional IMA material memory cell. Referring to FIG. 2, a plurality of magnetic domains on a magnetic track 120 respectively stores one bit data by the magnetizing direction. A reading device 122 identifies the magnetizing direction of the magnetic domain passed thereby, and determines whether the stored bit data is "0" or "1" according to a read magnetoresistance.

FIG. 3 is a schematic diagram illustrating an operation method of a conventional magnetic track. Referring to FIG. 3, according to a driving mechanism of FIG. 1, the magnetic track 120 is formed in a U-type structure. As the domain walls are driven by the electronic current, the domain walls sequentially pass through the reading device 122. The reading device 122 read the magnetoresistances to identify the bit data. Since the IMA material memory cell has a relatively long length, and a width of the domain wall is relatively large, which may occupy a larger area, a magnetic track made of the PMA material is preferred.

FIG. 4 is a schematic diagram illustrating a storage mechanism of a conventional PMA material memory cell. Referring to FIG. 4, a magnetic track 124 of the PMA material also includes a plurality of magnetic domains, though a magnetizing direction of each magnetic domain is perpendicular to the magnetic track 124. The reading device 122 detects the magnetizing direction of each magnetic domain to determine the stored bit data. However, a magnetic moment of the PMA material has to conquer a demagnetisation field to obtain a better perpendicular magnetic anisotropy, so that a fabrication process thereof is relatively difficult.

A data writing process is similar to the data reading process of the reading device 122, by which a magnetizing direction of the pass-by magnetic domain is changed to a desired magnetizing direction, so as to achieve the write function. The conventional writing device 108 of FIG. 1 generates a magnetic field to the magnetic domain for writing data. Regarding the writing device, an efficiency of generating the magnetic field is relatively low, which may consume relatively more power, and the writing device is not easy to be miniaturized.

How to effectively and correctly write data to the magnetic domain while considering a stability and a smaller size of the device is one of important development directions of the memory device.

SUMMARY

The embodiment provides a magnetic shift register memory including a magnetic track and a reference magnetic region. The magnetic track has a plurality of magnetic domains. Each of the magnetic domains stores one bit data. One end of the magnetic domains is set with a first data injection domain for storing a first data. The reference magnetic region is disposed at a side of or near the magnetic track for storing a second data. The magnetic shift register memory further includes a second data injection domain located adjacent to the first data injection domain.

BRIEF DESCRIPTION OF THE DRAWINGS

The accompanying drawings are included to provide a further understanding of the embodiment, and are incorporated in and constitute a part of this specification. The drawings illustrate embodiments and, together with the description, serve to explain the principles of the invention.

DESCRIPTION OF THE EMBODIMENTS

Embodiments are provided below for describing the embodiment in detail, thought the embodiment is not limited to the provided embodiments, and the provided embodiments can be mutually combined, suitably.

Figure 1:
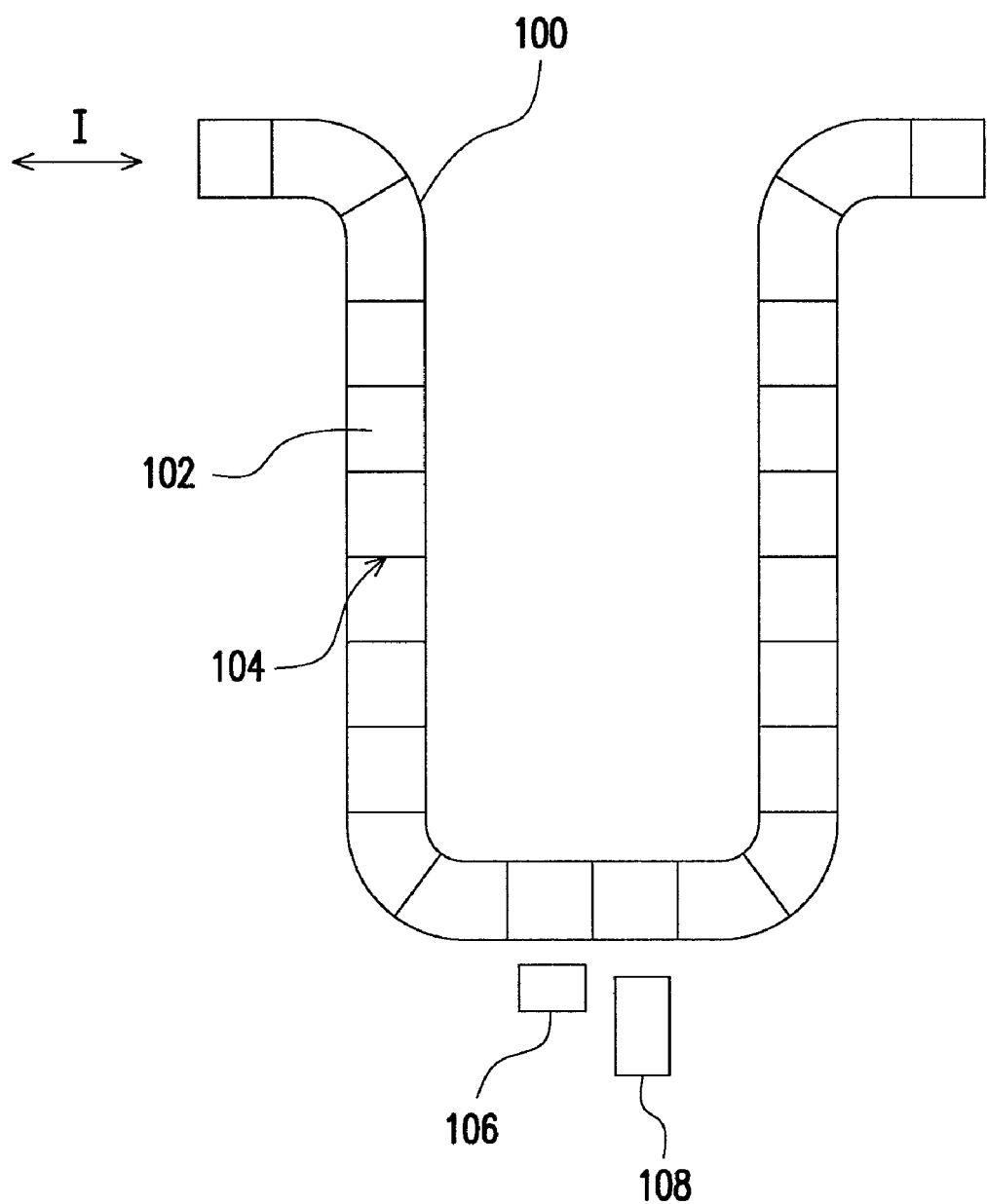
FIG. 1 is a schematic diagram illustrating a conventional magnetic shift register memory designed according to a current-driven domain wall motion mechanism.
Figure 3:
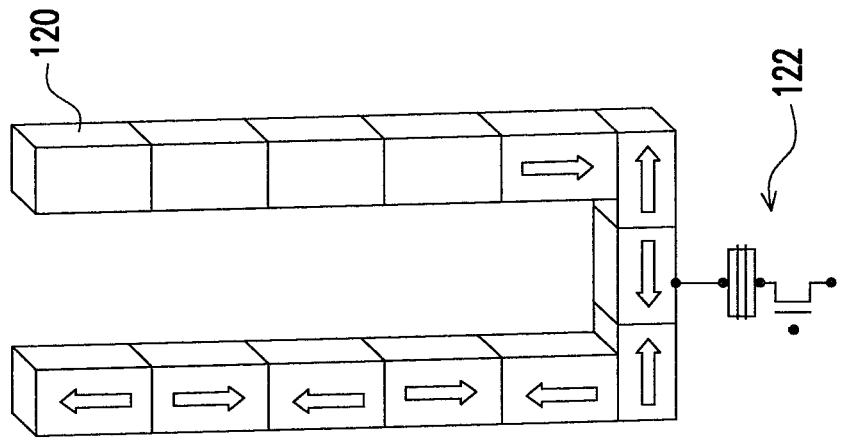
FIG. 3 is a schematic diagram illustrating an operation method of a conventional magnetic track.
Figure 2:
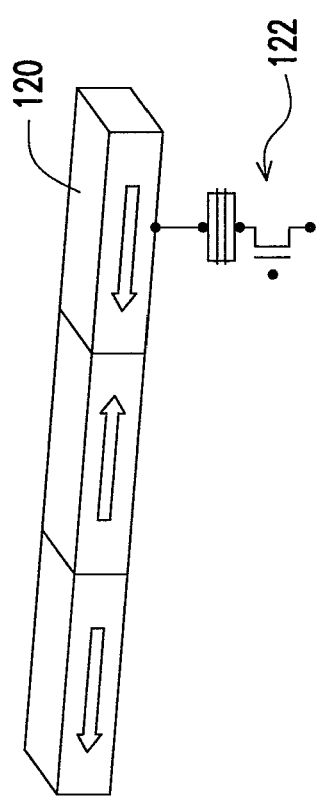
FIG. 2 is a schematic diagram illustrating a storage mechanism of a conventional in-plan magnetic anisotropy (IMA) material memory cell.
Figure 4:
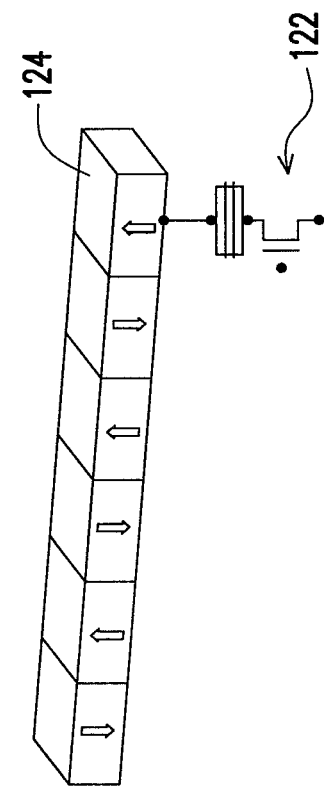
FIG. 4 is a schematic diagram illustrating a storage mechanism of a conventional perpendicular magnetic anisotropy (PMA) material memory cell.
Figure 5A:
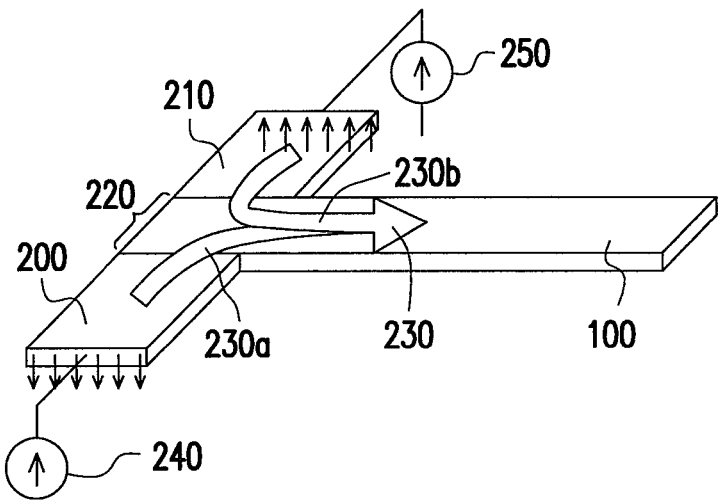
FIGS. 5A and 5B are respectively a three-dimensional view and a top view of a magnetic shift register memory structure according to a concept of the embodiment.
Figure 5B:
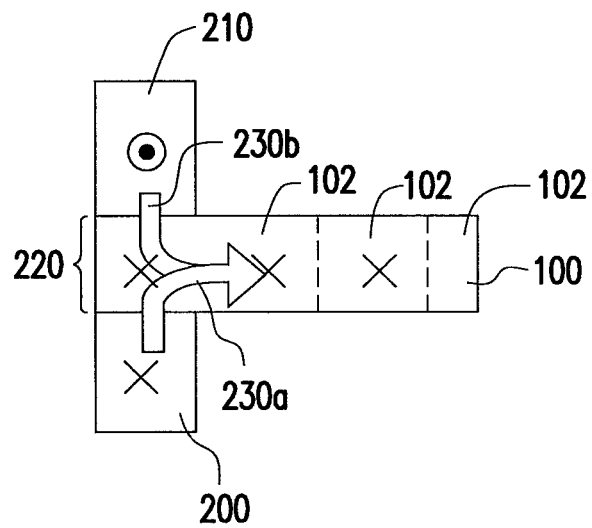

Different to the conventional write method, a data writing method of the present invention is implemented through a data injection approach. The embodiment is directed to a magnetic shift register memory, in which based on a stack-type injector, a write structure can be simplified to at least achieve an effect of size reduction. FIGS. 5A and 5B are respectively a three-dimensional view and a top view of a magnetic shift register memory structure according to a concept of the embodiment.

Referring to FIG. 5A and FIG. 5B, a magnetic track 100 of the magnetic shift register memory structure has a plurality of continuous magnetic domains, and each of the magnetic domains has a memory capacity of one bit. Further, a first and a second domain-wall injection layers 200 and 210 are cross-connected to a track endpoint 220 of the magnetic track 100, which are, for example, connected in a right angle, though the embodiment is not limited thereto. For example, the first domain-wall injection layer 200 fixedly stores one bit data, and the second domain-wall injection layer 210 fixedly stores another bit data.

The so-called "fixedly store one bit data" refers to that the stored bit data is not changed due to operations and uses, though during a fabrication process, a magnetizing direction can be written, so as to form the embedded written data. Regarding to a perpendicular magnetic substance, a magnetizing direction thereof is perpendicular to a plane of the magnetic tack 100, as that shown by arrows. The magnetizing direction corresponds to one bit data, for example, a magnetizing direction of the first domain-wall injection layer 200 is fixed to be downward, and a magnetizing direction of the second domain-wall injection layer 210 is fixed to be upward. Namely, when the magnetic track 100 is fabricated, magnetic domain information "0" and "1" are pre-fabricated or programmed in the first and the second domain-wall injection layers 200 and 210.

Referring to FIG. 5B, it is known that the magnetic domains 102 on the magnetic track 100 respectively have a magnetizing direction, for example, the magnetizing directions of the magnetic domains 102 are all downward, which are the same to the magnetizing direction of the first domain-wall injection layer 200. There is no domain wall between the first domain-wall injection layer 200 and the adjacent magnetic domain 102 on the magnetic track 100, though there is a domain wall between the second domain-wall injection layer 210 and the adjacent magnetic domain 102 on the magnetic track 100. In other words, since the magnetizing directions of the first domain-wall injection layer 200 and the second domain-wall injection layer 210 are reversed, one of the first and the second domain-wall injection layers 200 and 210 and the magnetic track 100 form a domain wall.

During a write operation, a driving current source 240 or a driving current source 250 can push the first or the second domain-wall injection layer 200 or 210 with the magnetic domain information "0" or "1" to the magnetic domain in the magnetic track 100 according to data to be written into the adjacent magnetic domain, which is shown as a flowing path 230a or 230b of the electronic current shown by an arrow 230. Here, besides injecting "0" and "1" to the magnetic track 100, the driving current sources 240 and 250 used for pushing the magnetic domains can simultaneously drive a motion of the domain walls in the magnetic track 100, so that power required by the conventional writing device is saved.

Figure 5C:
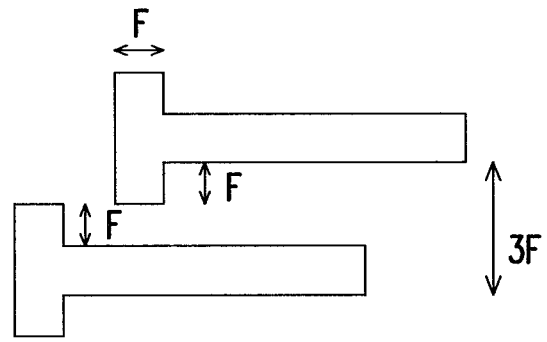
FIG. 5C is a schematic diagram illustrating a configuration of magnetic tracks according to a structure of FIG. 5A.

In terms of size, since a data injection structure is a horizontal T-type structure, it occupies relatively large area. FIG. 5C is a schematic diagram illustrating a configuration of magnetic tracks according to a structure of FIG. 5A. Referring to FIG. 5C, since an actual memory includes a plurality of T-type magnetic tracks, an arranging method thereof is as that shown in FIG. 5C, which generally requires a bit size of $3F^2$. Such T-type data injectors extend in a transverse direction from two sides of the magnetic track, so that regarding a layout thereof, two adjacent magnetic tracks are bound to be mutually pushed, which may cause an implementation difficulty, and a higher integration density cannot be achieved.

Considering the aforementioned design of the T-type data injectors, an embodiment provides a design to at least ameliorate a size problem, by which two T-type structures extending in a transverse direction can be removed. According to the design provided by the embodiment, one of two data injectors is disposed at a head end of the magnetic track, and another data injector is disposed above (beneath) the magnetic track. Therefore, in case of a top view, one magnetic track with equal width remains, so that two magnetic tracks can be closely disposed in a transverse direction, and therefore a higher bit integration density can be achieved.

Figure 6A:
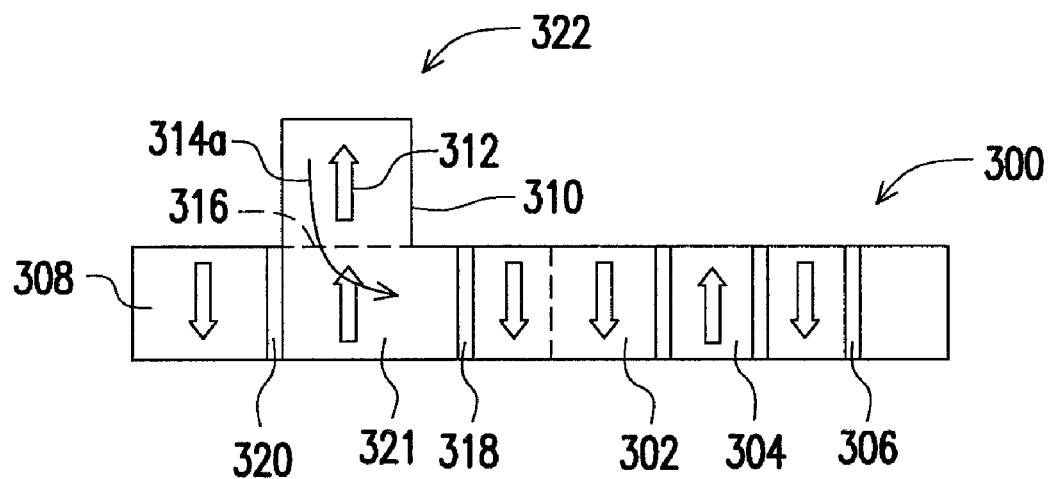
FIGS. 6A and 6B are cross-sectional views illustrating an operation mechanism of a magnetic shift register memory according to an embodiment.
Figure 6B:
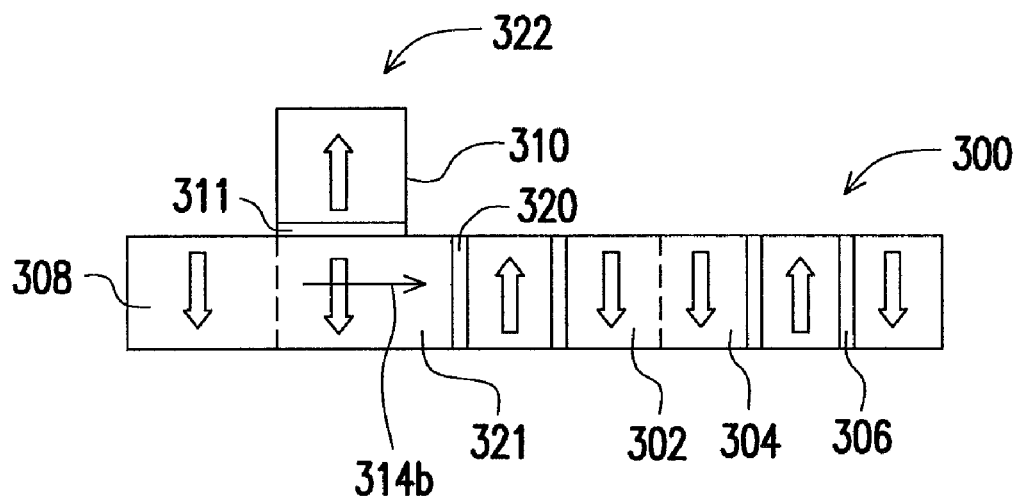

FIGS. 6A and 6B are cross-sectional views illustrating an operation mechanism of the magnetic shift register memory according to an embodiment. Referring to FIG. 6A, a basic structure of the magnetic shift register memory includes a magnetic track 300 and a reference magnetic region 310. The magnetic track 300 has a plurality of magnetic domains, and each of the magnetic domains can store one bit data. For example, a magnetic domain 302 stores data of a downward magnetizing direction, which may correspond to data "1", and a magnetic domain 304 stores data of an upward magnetizing direction, which may correspond to data "0". One end of the magnetic domains of the magnetic track 300 is set with a data injection domain 308 for storing one fixed data, for example, data of the downward magnetizing direction. A data injection domain (i.e. the reference magnetic region 310) is located adjacent to the data injection domain 308. Namely, the reference magnetic region 310 is located at a side of the magnetic track 300. In the embodiment, the reference magnetic region 310 is, for example, vertically stacked over a magnetic domain 321 of the magnetic track 300. In an embodiment, the magnetic domain 321 is one of the magnetic domains on the magnetic track 300, which is a buffer magnetic domain functioned in cooperation with the reference magnetic region 310 and the data injection domain 308 to inject data into other data storage magnetic domain in the magnetic track 300. However, the magnetic domain 321 can also be used to store data. The reference magnetic region 310 stores another fixed data, for example, data of an upward magnetizing direction 312. The data injection domain 308 and the reference magnetic region 310 form a data injector 322, and the magnetic domain 321 is a magnetic domain storing a first data injected from the data injection domain 308 or the reference magnetic region 310.

A data writing mechanism is described below. Assuming the magnetic domain 321 originally has the downward magnetizing direction as that shown in FIG. 6B, since the magnetizing direction stored by the data injection domain 308 is downward, there is no domain wall between the data injection domain 308 and the magnetic domain 321. Since magnetizing directions stored by the reference magnetic region 310 and the magnetic domain 321 are reversed, a first domain wall 311 is formed between the reference magnetic region 310 and the magnetic domain 321. In FIG. 6A, when data of the reference magnetic region 310 is about to be written onto the magnetic track 300, a driving electronic current flows to a data storage region on the magnetic track 300 along a path shown by an arrow 314a. Now, the first domain wall 311 of FIG. 6B is moved to a position where a domain wall 318 is located in FIG. 6A, and the magnetic domains 302 and 304 and a domain wall 306 on the magnetic track 300 are shifted. One shift distance is one magnetic domain, though if a plurality data is written, the domain wall 318 is shifted for a plurality of the magnetic domains, and a mechanism thereof is known by those skilled in the art.

Referring to FIG. 6B, in another writing mechanism, when data of the data injection domain 308 is written to the magnetic track 300, the driving electronic current flows to the magnetic track 300 along a path shown by an arrow 314b. Now, assuming an original state of the magnetic domain 321 is as that shown in FIG. 6A, and the magnetic domain 321 stores data of the upward magnetizing direction, so that a second domain wall 320 of FIG. 6A is pushed onto the magnetic track 300, and is moved to a position where the domain wall 318 is located in FIG. 6A, as that shown in FIG. 6B. Now, the first domain wall 311 is again formed between the magnetic domain 321 and the reference magnetic region 310, and there is no domain wall between the magnetic domain 321 and the data injection domain 308. If data of the reference magnetic region 310 is injected to the magnetic track 300 at next time, the first domain wall 311 is also pushed and injected onto the magnetic track 300, and the data thereof is accordingly written.

In other words, in terms of a physical phenomenon, the above injection mechanism can inject a first data onto the magnetic track through a current-induced domain wall motion (CIDWM) according to a spin torque transfer mechanism. The second data injection domain of the magnetic track is a magnetic reference layer directly connected to the magnetic track in a stacking manner. The magnetic reference layer is pre-set with a magnetic domain of a second direction (upward), which can also inject a second data onto the magnetic track through the CIDWM according to the spin torque transfer mechanism.

The material of the magnetic track is not limited to perpendicular magnetic anisotropy (PMA) materials such as CoNi multi-layer films, CoPt or CoPd alloy, or in-plan magnetic anisotropy (IMA) materials such as NiFe. A material of the first data injection domain located at the head end can be the same to the material of the magnetic track, or a coercivity thereof is increased by an additional process to improve the reliability and stability of such data injector. The magnetic reference layer located above or below the magnetic track can be a single magnetic reference layer with a material the same to or different to that of the magnetic track. A coercivity of the magnetic reference layer can be increased by an additional process, or the magnetic reference layer may have a synthetic anti-ferromagnetic multi-layer films design.

The two data injection domains of the data injector can be initialised through an external magnetic field or current. Once the initialisation is completed, the two data injection domains may have fixed data configurations with reversed magnetizing directions. A domain wall can be formed on an interface between each of the two data injection domains and the magnetic track, though the domain walls on both of the interfaces are not simultaneously formed.

Figure 7:
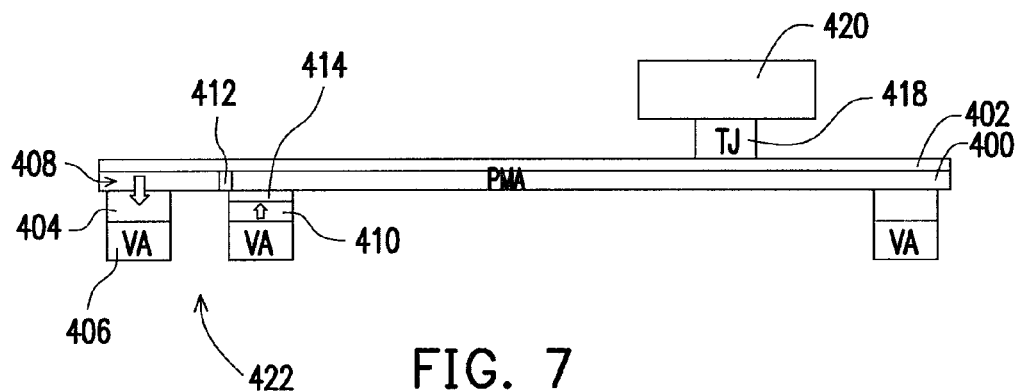
FIGS. 7-9 are cross-sectional views of a magnetic shift register memory according to several embodiments.
Figure 8:
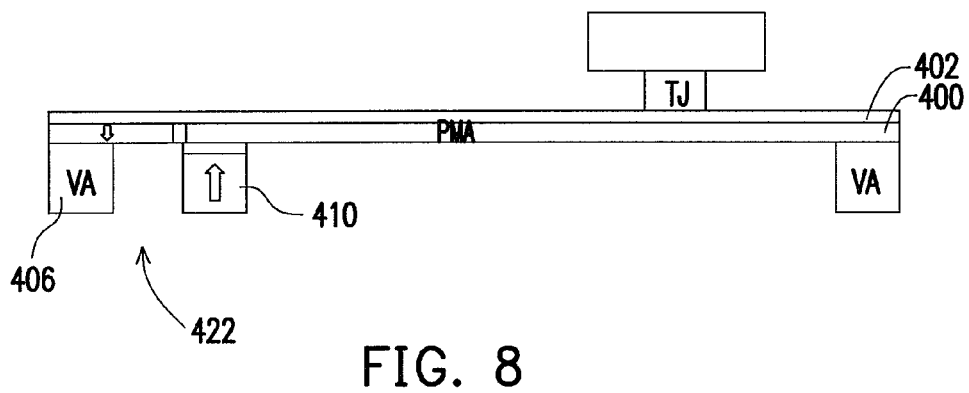
Figure 9:
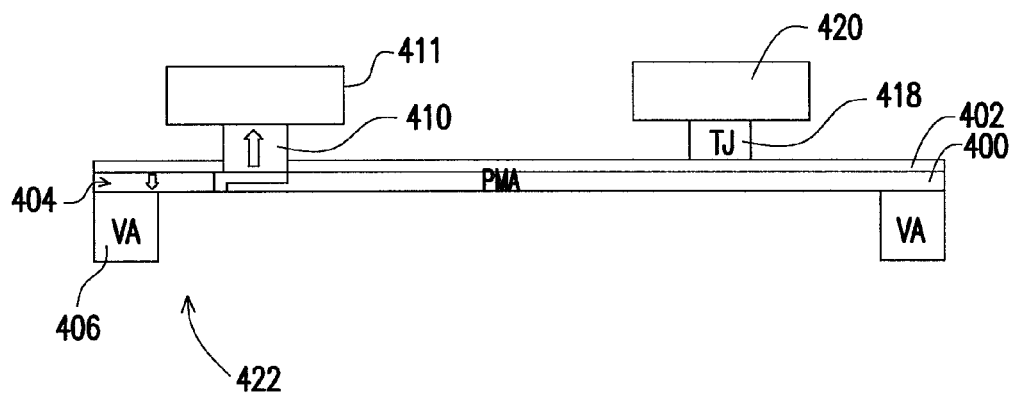

According to a mechanism shown in FIGS. 6A and 6B, the reference magnetic domain 310 is a staking layer directly contacted to the magnetic track 300. FIGS. 7-9 are cross-sectional views of a magnetic shift register memory according to several embodiments. Referring to FIG. 7, regarding an actual fabricated structure, one side of a magnetic track 400 has a non-magnetic tunnelling barrier layer 402. A reading device (a tunnelling junction (TJ) device) 418 is formed on the non-magnetic tunnelling barrier layer 402. An electrode layer 420 is formed on the reading device 418. A data injector 422 is disposed at an end (for example, a head end) of the magnetic track 400.

In the embodiment, another side of the magnetic track 400 does not have the non-magnetic tunnelling barrier layer 402. A data injection domain 408 is set at one end of the magnetic track 400, and a domain wall 412 can be formed between the data injection domain 408 and a follow-up data injection domain. A reference magnetic region 410 is, for example, formed by a ferromagnetic layer, which has an upward magnetizing direction. A domain wall 414 is probably formed between the reference magnetic region 410 and the magnetic track 400. However, one of the domain walls 412 and 414 exist under a stable state. In the embodiment, to enhance a stability of data of the data injection domain 408, a ferromagnetic layer 404 is additionally connected to the data injection domain 408, so as to maintain a stable downward magnetizing direction of the data injection domain 408. A metallic via layer (VA) 406 is connected below the ferromagnetic layer 404. Moreover, a ferromagnetic layer and a via layer can also be configured at a tail end of the magnetic track 400 to serve as a connection endpoint of the electronic current. In such structure, thickness of the ferromagnetic layer and the via layer are the same, which may facilitate simplifying a fabrication flow, so that patterns of the structure can be simultaneously fabricated in a same fabrication process. Further, heights of the devices in the structure are equivalent, which also facilitates simplifying the fabrication flow.

Referring to FIG. 8, in this embodiment, the whole reference magnetic region 410 is formed by the ferromagnetic material, and is directly contacted to the magnetic track 400. The via layer 406 is also directly contacted to the magnetic track 400 at a corresponding position.

Referring to FIG. 9, in such design variation, the reference magnetic region 410 is, for example, disposed at a side of the magnetic track 400 having the non-magnetic tunnelling barrier layer 402, though the reference magnetic region 410 penetrates through the non-magnetic tunnelling barrier layer 402 and contacts the magnetic track 400, and now a fabrication process thereof is compatible to a fabrication process of forming the electrode layer 420, and an electrode layer 411 is formed on the reference magnetic region 410 to apply an electronic current for the CIDWM operation.

FIGS. 7-9 illustrate a plurality of fabrication variations of the magnetic shift register memory, though a basic mechanism thereof remains the same.

Figure 10A:
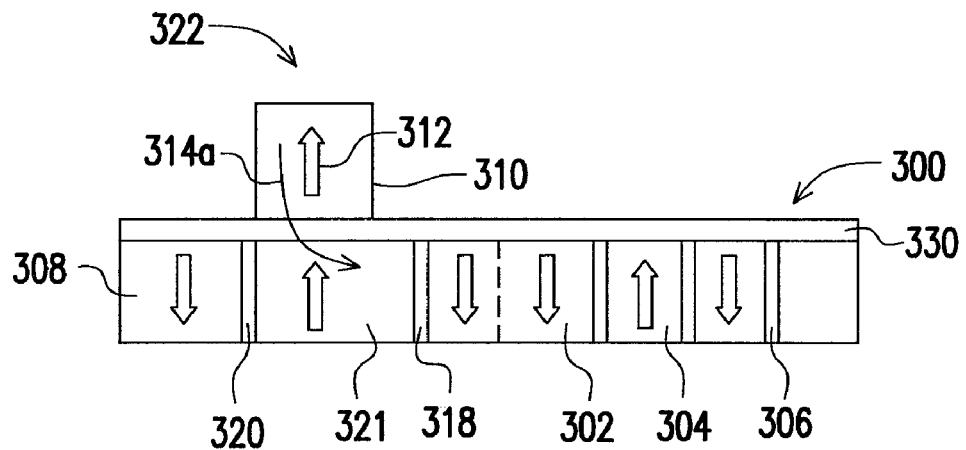
FIGS. 10A and 10B are cross-sectional views illustrating an operation mechanism of a magnetic shift register memory according to an embodiment.
Figure 10B:
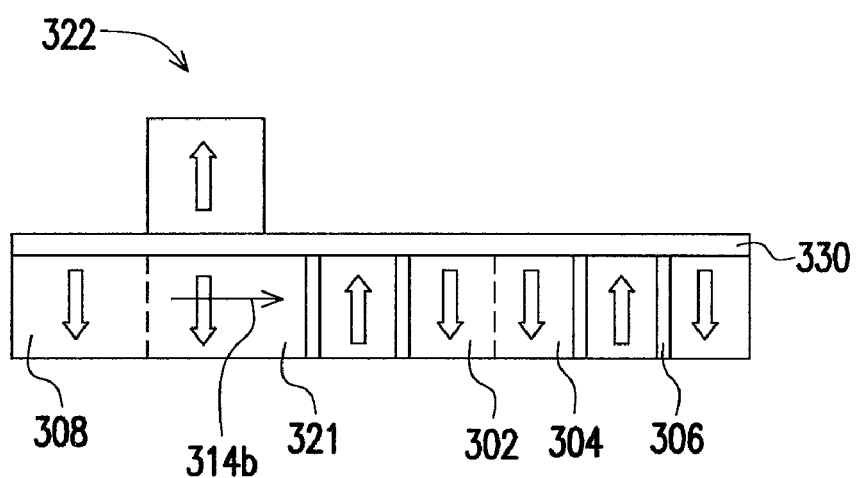

Further, design of FIGS. 6A and 6B is not unique. FIGS. 10A and 10B are cross-sectional views illustrating an operation mechanism of the magnetic shift register memory according to an embodiment. Referring to FIG. 10A, a structure thereof is similar to that of FIG. 6A except that a non-magnetic spacer 330 is formed on the magnetic track 300. The non-magnetic spacer 330 can be a metal spacer, or a tunnelling barrier layer, and the reference magnetic region 310 is disposed on the non-magnetic spacer 330, and is located corresponding to the magnetic domain 321.

The operation mechanism of the embodiments of FIGS. 10A and 10B is similar to that of the embodiments of FIGS. 6A and 6B. Referring to FIG. 10A, a data injector 322 including two data injection domains 308 and 310 is configured at one end of the magnetic track 300, wherein the second data injection domain 310 is formed by the reference magnetic region 310 in a stacking manner, which is connected to the magnetic track 300 through the non-magnetic spacer 330. The reference magnetic region 310 is, for example, preset with a magnetic domain having the upward magnetizing direction (data 0), which can cause a current-induced magnetization reversal according to the spin torque transfer mechanism, and inject the data (data 0) into the magnetic domain 321 on the magnetic track 300. A material of the non-magnetic spacer 330 can be an insulating layer of MgO or AlOx, etc., which is, for example, a non-magnetic tunnelling layer. Further, the non-magnetic spacer 330 can also be a metal layer of Cu or Ru, etc., though the reference magnetic region 310 is required to be connected to the magnetic track 300 from another side, as that shown in FIG. 12.

Referring to FIG. 10B, the data injection domain 308 located at one end of the magnetic track 300 is, for example, preset with a magnetic domain having the downward magnetizing direction (data 1), which can inject the data (data 1) of the data injection domain 308 into the magnetic domain 300 through the current-driven domain wall motion according to the spin torque transfer mechanism.

Regarding the cross-sectional structures of FIGS. 6A and 6B or FIGS. 10A and 10B, in case of a top view, the magnetic shift register memory still has a width of one magnetic track 300, and does not have the transversely extended injection structures.

Figure 11:
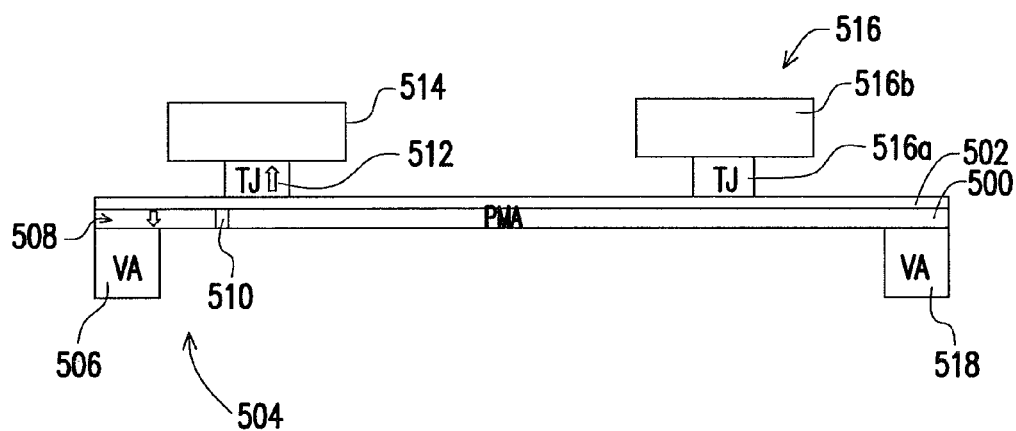
FIGS. 11 and 12 are cross-sectional views of a magnetic shift register memory according to several embodiments.
Figure 12:
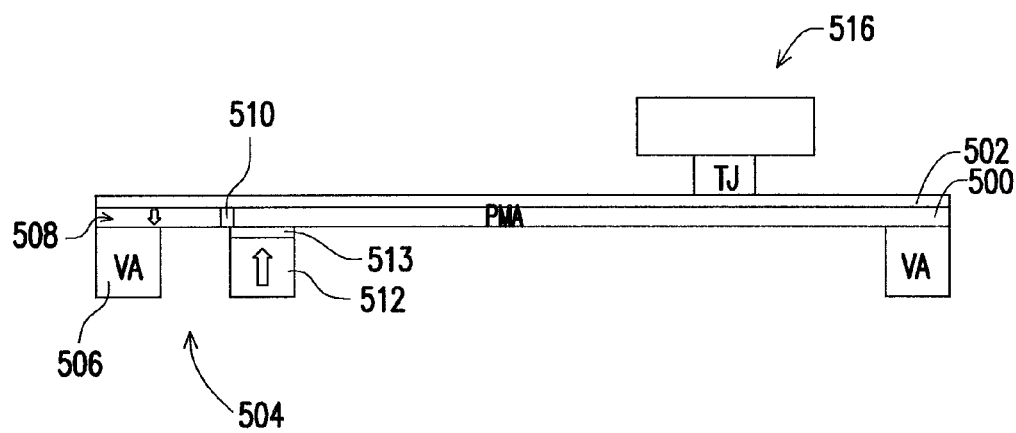

FIGS. 11 and 12 are cross-sectional views of a magnetic shift register memory according to several embodiments. Referring to FIG. 11, according to a design of FIGS. 10A and 10B, a reference magnetic region 512 is not directly contacted to a magnetic track 500. Regarding an actual fabricated structure, a data injection domain 508 located at one end of the magnetic track 500 is directly contacted to the electrode through a via layer (VA) 506, and another end of the magnetic track 500 also has a via layer (VA) 518. A non-magnetic tunnelling barrier layer 502 located on the top of the magnetic track 500 is formed by an insulating material. The reference magnetic region 512 can be a TJ device similar to the reading device, and an electrode structure 514 is formed on the top of the reference magnetic region 512. A reading device 516 is located, for example, at another end of the magnetic track 500. The reading device 516 includes a TJ device 516a and an electrode layer 516b. Therefore, during a fabrication process, the reference magnetic region 512 and the reading device 516 can be fabricated in a same fabrication step, and the via layers 506 and 518 can also be fabricated in a same fabrication step. The reference magnetic region 512, the data injection domain 508 and a corresponding data injection domain on the magnetic track 500 form a data injector 504. During the operation, if the data injection domain 508 and the follow-up data injection domain have different magnetizing directions, a domain wall 510 is formed there between.

Referring to FIG. 12, in this embodiment, the reference magnetic region 512 can be fabricated beneath the magnetic track 500, and is connected to the magnetic track 500 through a non-magnetic spacer 513. The non-magnetic spacer 513 is formed by, for example, an insulating layer of MgO or AlOx, etc., or a metal layer of Cu or Ru, etc.

Referring to FIG. 11, The TJ device located at the right hand is the reading device, and the TJ device located at the left hand is a data injection domain, and such data injection domain can be fabricated together with the read TJ device on the right hand. The non-magnetic spacer is formed by a tunnelling barrier layer. The right hand TJ device can read data on the magnetic track through a spin tunnelling effect, and the left hand TJ device can also implement the spin torque transfer through the spin tunnelling effect, so as to cause a magnetization reversal of the magnetic domain. Moreover, such non-magnetic spacer can also be a metal layer of Cu and Ru, etc., so that the right hand TJ device can still read data on the magnetic track through the spin tunnelling effect, and the left hand TJ device can generate a spin current through a giant magnetoresistance (GMR) effect, so as to implement the spin torque transfer and cause a magnetization reversal of the magnetic domain. In FIG. 12, under the magnetic track 500, the reference magnetic region 512 is connected to the magnetic track 500 through the metallic non-magnetic spacer 513 (for example, Cu, Ru, Pt, etc.), which may generate the spin current to form the spin torque transfer, so as to cause the magnetization reversal of the magnetic domain and inject the data onto the magnetic track 500. The non-magnetic spacer formed by the tunnelling barrier layer can be disposed on the top of the magnetic track 500, so as to form the reading device to obtain a relatively great read signal.

Figure 13:
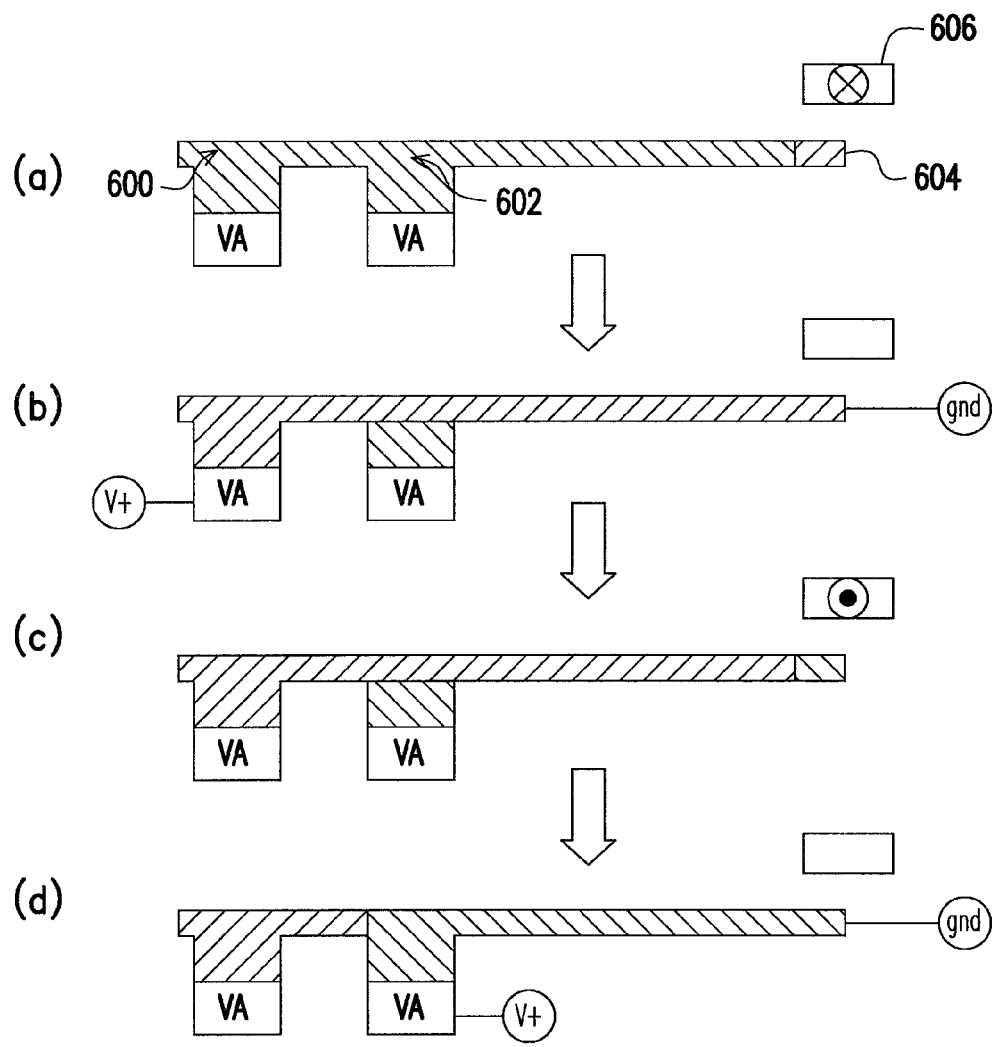
FIG. 13 is a schematic diagram illustrating an initialisation flow according to an embodiment.

In terms of the operation, the magnetic shift register memory is required to be initialised, so as to inject the data into the magnetic domain and the reference magnetic domain to implement an initial state setting. FIG. 13 is a schematic diagram illustrating an initialisation flow according to an embodiment. Referring to FIG. 13(a), before the initialisation, a data injection domain 600 and a reference magnetic region 602 of the magnetic track and all of the magnetic domains on the magnetic track probably have data of the same magnetizing direction, or data of different magnetizing directions. First, data of a magnetic domain 604 located at the tail end of magnetic track is changed to data of a first magnetizing direction through an external magnetic field, so that a domain wall is formed at an interface thereof. Then, referring to FIG. 13(b), an electronic current is exerted to shift the domain wall to the left (i.e. a voltage source V+ is exerted to a via layer (VA) on the data injection domain 600). As a result, besides the reference magnetic region 602, data of all of the magnetic domains are changed to the data of the first magnetizing direction. Then, referring to FIG. 13(c), data of a second magnetizing direction is generated to the magnetic domain 604 located at the tail end, so that a domain wall is also formed at the interface thereof. Referring to FIG. 13(d), the voltage source V+ is now exerted on the reference magnetic region 602, so that the domain wall is shifted to the reference magnetic region 602, and the magnetic domains between the reference magnetic region 602 and tail end region all have the data of the second magnetizing direction, so as to provide an actual data storage utilization. The data injection domain 600 and the reference magnetic region 602 respectively, therefore, store two different fixed data for injecting the data to the actual data storage magnetic domains on the magnetic track.

Namely, the two data injection domains of the data injector can be initialised through the external magnetic field or current. Once the initialisation is completed, the two data injection domains may have fixed data configurations with reversed magnetizing directions. In the case shown in FIG. 6, a domain wall can be formed on an interface between each of the two data injection domains and the magnetic track, though the domain walls on both of the interfaces are not simultaneously formed.

It will be apparent to those skilled in the art that various modifications and variations can be made to the structure of the embodiment without departing from the scope or spirit of the invention. In view of the foregoing, it is intended that the embodiment cover modifications and variations of this embodiment provided they fall within the scope of the following claims and their equivalents.

What is claimed is:

1. A magnetic shift register memory, comprising:
    a magnetic track, having a plurality of magnetic domains, each of the magnetic domains stores one bit data, wherein a first end of the magnetic domains is set with a first data injection domain for storing a first data; and
    a reference magnetic region, disposed at a side of or near the magnetic track for storing a second data.

2. The magnetic shift register memory as claimed in claim 1, wherein the reference magnetic region is stacked to the magnetic track in a vertical direction.

3. The magnetic shift register memory as claimed in claim 1, further comprising a second data injection domain disposed adjacent to the first data injection domain, wherein the reference magnetic region corresponds to the second data injection domain.

4. The magnetic shift register memory as claimed in claim 3, wherein the reference magnetic region includes the second data injection domain of the magnetic track.

5. The magnetic shift register memory as claimed in claim 4, wherein the reference magnetic region comprises a structure layer stacked with a ferromagnetic layer and a via layer, and the ferromagnetic layer stores the second data and contacts the magnetic track.

6. The magnetic shift register memory as claimed in claim 5, wherein a non-magnetic tunnelling barrier layer is disposed at a first side of the magnetic track, and the reference magnetic region is disposed at a second side of the magnetic track that is opposite to the first side.

7. The magnetic shift register memory as claimed in claim 6, wherein the first data injection domain of the magnetic track contacts a ferromagnetic layer storing the first data, and an outer surface of the ferromagnetic layer has a via layer.

8. The magnetic shift register memory as claimed in claim 4, wherein the reference magnetic region comprises a ferromagnetic layer storing the second data and contacted to the magnetic track.

9. The magnetic shift register memory as claimed in claim 8, wherein a non-magnetic tunnelling layer is disposed at a first side of the magnetic track, and the reference magnetic region is disposed at a second side of the magnetic track that is opposite to the first side.

10. The magnetic shift register memory as claimed in claim 9, further comprising a via layer contacted to the first data injection domain of the magnetic track.

11. The magnetic shift register memory as claimed in claim 4, further comprising a non-magnetic tunnelling barrier layer disposed at a first side of the magnetic track, wherein the reference magnetic region penetrates through the non-magnetic tunnelling barrier layer and contacts the magnetic track.

12. The magnetic shift register memory as claimed in claim 11, wherein the reference magnetic region comprises a ferromagnetic layer storing the second data.

13. The magnetic shift register memory as claimed in claim 11, further comprising a via layer located at a second side of the magnetic track that is opposite to the first side, and contacted to the first data injection domain.

14. The magnetic shift register memory as claimed in claim 3, further comprising:
    a non-magnetic tunnelling layer, disposed at a first side of the magnetic track, wherein the reference magnetic region is disposed corresponding to the second data injection domain without contacting the magnetic track.

15. The magnetic shift register memory as claimed in claim 14, further comprising:
    a via layer, disposed at a second side of the magnetic track, and contacted to the first data injection domain.

16. The magnetic shift register memory as claimed in claim 14, wherein the reference magnetic region is disposed on the non-magnetic tunnelling barrier layer, and located corresponding to a position of the second data injection domain.

17. The magnetic shift register memory as claimed in claim 16, further comprising:
    a via layer, disposed on the magnetic track, and contacted to the first data injection domain.

18. The magnetic shift register memory as claimed in claim 14, further comprising a non-magnetic spacer located at a second side of the magnetic track and corresponding to a position of the second data injection domain, wherein the reference magnetic region is disposed on the non-magnetic spacer.

19. The magnetic shift register memory as claimed in claim 14, further comprising:
    a via layer, disposed at the second side of the magnetic track, and contacted to the first data injection domain.

20. The magnetic shift register memory as claimed in claim 14, wherein materials of the magnetic domains of the magnetic track are perpendicular magnetic anisotropy (PMA) materials.

21. The magnetic shift register memory as claimed in claim 1, further comprising a connection endpoint disposed at a second end of the magnetic domains.

* * * * *